US012624437B2

(12) United States Patent
Lee et al.

(10) Patent No.: US 12,624,437 B2
(45) Date of Patent: May 12, 2026

(54) MASK ASSEMBLY AND DEPOSITION APPARATUS OF THE SAME

(71) Applicant: Samsung Display Co., Ltd., Yongin-si (KR)

(72) Inventors: Sangshin Lee, Yongin-si (KR); Sanghoon Kim, Hwaseong-si (KR); Jongsung Park, Hwaseong-si (KR); Sang Min Yi, Suwon-si (KR); Seungjin Lee, Suwon-si (KR); Eunjoung Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 775 days.

(21) Appl. No.: 17/963,944

(22) Filed: Oct. 11, 2022

(65) Prior Publication Data

US 2023/0119614 A1 Apr. 20, 2023

(30) Foreign Application Priority Data

Oct. 15, 2021 (KR) ........................ 10-2021-0137926

(51) Int. Cl.
*C23C 14/04* (2006.01)
*H01L 51/00* (2006.01)
*H10K 71/16* (2023.01)

(52) U.S. Cl.
CPC ......... *C23C 14/042* (2013.01); *H10K 71/166* (2023.02)

(58) Field of Classification Search
None
See application file for complete search history.

(56) References Cited

U.S. PATENT DOCUMENTS

| | | | | |
|---|---|---|---|---|
| 8,402,917 B2* | 3/2013 | Ko | ........................ | B05C 11/00 |
| | | | | 228/180.1 |
| 9,321,074 B2* | 4/2016 | Ko | ........................ | B05C 11/00 |
| 9,975,133 B2* | 5/2018 | Kobayashi | ............. | C23C 14/24 |
| 9,975,134 B2* | 5/2018 | Ko | ........................ | C23C 14/042 |
| 10,557,191 B2* | 2/2020 | Nishida | ................ | H10K 71/166 |
| 10,663,857 B2* | 5/2020 | Lv | ........................... | C23C 14/12 |
| 10,787,729 B2* | 9/2020 | Bai | ........................ | C23C 14/24 |
| 11,396,693 B2* | 7/2022 | Bai | ........................ | B05C 21/005 |
| 12,054,820 B2* | 8/2024 | Moon | .................. | C23C 14/042 |
| 12,077,841 B2* | 9/2024 | Kim | ........................ | C23C 14/08 |
| 12,116,660 B2* | 10/2024 | Son | ........................ | G03F 7/0015 |
| 2011/0067630 A1* | 3/2011 | Ko | ........................ | C23C 14/042 |
| | | | | 118/721 |

(Continued)

FOREIGN PATENT DOCUMENTS

| | | |
|---|---|---|
| JP | 2001-237073 | 8/2001 |
| KR | 1020120105292 A | 9/2012 |

(Continued)

*Primary Examiner* — Jethro M. Pence

(74) *Attorney, Agent, or Firm* — CANTOR COLBURN LLP

(57) ABSTRACT

A mask assembly includes a first mask having a first opening and at least one second mask disposed on the first mask, each at least one second mask including a deposition area having second openings, an inner area surrounding the deposition area, and an outer area having third openings which surround the margin area. A line defining the outer boundary of an inner surface which defines the first opening overlaps the inner area when viewed in plan.

14 Claims, 15 Drawing Sheets

(56)        References Cited

U.S. PATENT DOCUMENTS

| | | | |
|---|---|---|---|
| 2012/0234236 A1* | 9/2012 | Ko | H10K 50/8426 |
| | | | 118/504 |
| 2016/0023230 A1* | 1/2016 | Ko | B05C 21/005 |
| | | | 118/504 |
| 2016/0079532 A1* | 3/2016 | Yi | H10K 71/10 |
| | | | 438/758 |
| 2021/0013415 A1* | 1/2021 | Kawasaki | C23C 16/042 |
| 2022/0002860 A1* | 1/2022 | Lee | C23C 14/042 |
| 2022/0178016 A1* | 6/2022 | Son | C23C 14/042 |
| 2023/0366075 A1* | 11/2023 | Kim | C23C 14/541 |

FOREIGN PATENT DOCUMENTS

| | | |
|---|---|---|
| KR | 10-1322130 | 10/2013 |
| KR | 1020190089074 A | 7/2019 |
| KR | 10-2020-0039901 | 4/2020 |

* cited by examiner

FIG. 1

MASK ASSEMBLY AND DEPOSITION APPARATUS OF THE SAME

CROSS REFERENCE TO RELATED APPLICATION

This application claims from and the benefit of Korean Patent Application No. 10-2021-0137926, filed on Oct. 15, 2021, which is hereby incorporated by reference for all purposes as if fully set forth herein.

BACKGROUND

Field

Embodiments of the invention relate generally to a mask assembly used for manufacturing display devices and more specifically, to a mask assembly with improved deposition precision and a deposition apparatus including the mask assembly.

Discussion of the Background

In general, a light emitting display device includes pixels and light emitting elements respectively disposed in the pixels. Each light emitting element includes a light emitting layer disposed between two electrodes. The light emitting layers included in the pixels are grouped in a plurality of groups.

A mask assembly is used to deposit the light emitting layers on a work piece that will become a substrate of the light emitting display device. The mask assembly includes a frame, an open mask, and a mask provided in the unit of a cell. Patterned light emitting layers are formed by placing the work piece on the mask and depositing a light emitting material on the work piece.

The above information disclosed in this Background section is only for understanding of the background of the inventive concepts, and, therefore, it may contain information that does not constitute prior art.

SUMMARY

Mask assemblies and deposition apparatus for manufacturing display panels including the same constructed according to the principles and illustrative embodiments of the invention are capable of reducing deposition defects in, and dead spaces of, the display panel.

For example, such a mask assembly includes a first mask having first openings and at least one second mask including a deposition area having second openings and an inner area surrounding the deposition area, the inner area overlapping boundary lines defining the first openings when viewed in plan. Thus, the deposition precision is improved, and a dead space of the display panel is reduced. The at least one second mask included in the mask assembly may further include an outer area surrounding the inner area with third openings, and thus adhesion between a substrate to be deposited and the mask is improved. Accordingly, the deposition precision is enhanced, and the display quality of the display panel is improved.

Additional features of the inventive concepts will be set forth in the description which follows, and in part will be apparent from the description, or may be learned by practice of the inventive concepts.

According to an aspect of the invention, a mask assembly includes a first mask having a first opening and at least one second mask disposed on the first mask including a deposition area having second openings, an inner area surrounding the deposition area, and an outer area having third openings which surround the inner area, wherein a line defining the outer boundary of an inner surface which defines the first opening overlaps the inner area when viewed in plan.

The inner area may have a closed-line shape when viewed in plan.

The third openings may be covered by the first mask when viewed from a rear side of the first mask.

The inner area may have a width between about 200 micrometers and about 500 micrometers when viewed in plan.

Each of the second openings may have a size different from a size of each of the peripheral openings.

A separation distance between the second openings adjacent to each other among the second openings may be different from a separation distance between the third openings adjacent to each other among the third openings.

The second openings may have a shape different from a shape of the third openings.

Each second mask may further include a welding area attached to the first mask and surrounding the outer area.

A boundary between the deposition area and the inner area may be defined as a first boundary line, a boundary between the inner area and the outer area may be defined as a second boundary line when viewed in plan, and the first boundary line includes a portion projecting toward the deposition area.

The second boundary line may include a portion projecting toward the deposition area to correspond to the projecting portion of the first boundary line.

The mask assembly may further include a module area surrounded by the deposition area and provided with module openings formed therein, and the module openings have a shape different from a shape of the second openings.

The mask assembly may further include a non-deposition area surrounded by the deposition area.

The second mask may have a thickness in at least a portion of the inner area smaller than a thickness of the second mask in the deposition area.

The second mask may include at least one of stainless steel, Invar, nickel, cobalt, nickel alloy, and nickel-cobalt alloy.

According to another aspect of the invention, a deposition apparatus includes a chamber, a mask assembly supporting a base substrate and including a first mask having a first opening and at least one second mask disposed on the first mask including a deposition area having second openings, an inner area surrounding the deposition area, and an outer area having third openings which surround the margin area, and a deposition source to spray a deposition material to the base substrate through the first openings, wherein a portion of the inner area and all of the deposition area are exposed through the first openings.

The third openings may be covered by the first mask when viewed from a rear side of the first mask.

All the second openings may overlap the first openings.

An area in which the deposition material is deposited in the base substrate may substantially entirely overlap the deposition area when viewed in plan.

The inner area may have sub-openings surrounding outermost second openings most closely adjacent to the inner area among the second openings.

The deposition apparatus may further include a fixing member disposed on the base substrate and including magnetic material.

It is to be understood that both the foregoing general description and the following detailed description are illustrative and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 1 is a cross-sectional view of an embodiment of a deposition apparatus constructed according to the principles of the invention.

DETAILED DESCRIPTION

Figure 2:
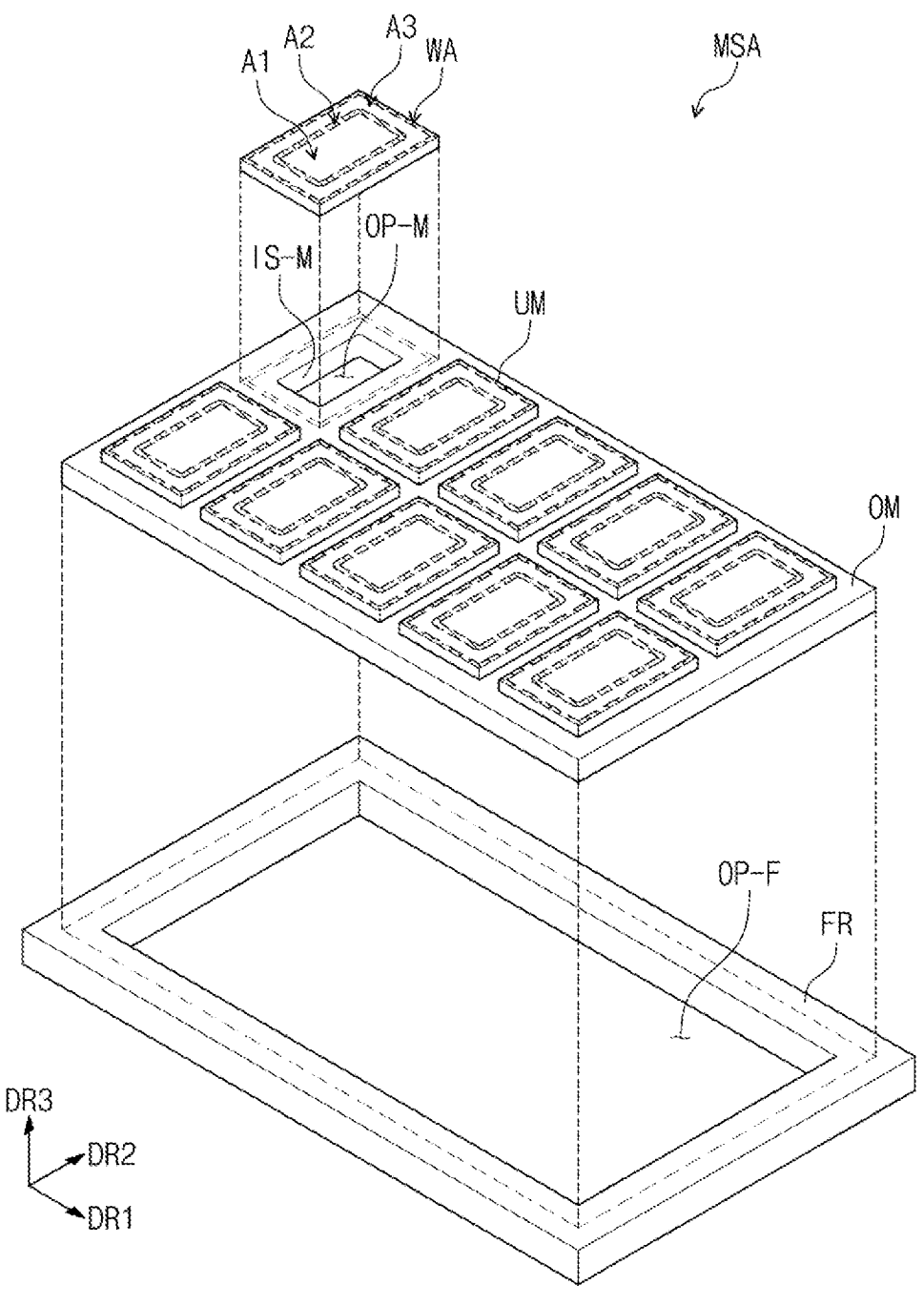
FIG. 2 is an exploded perspective view of an embodiment of a mask assembly constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
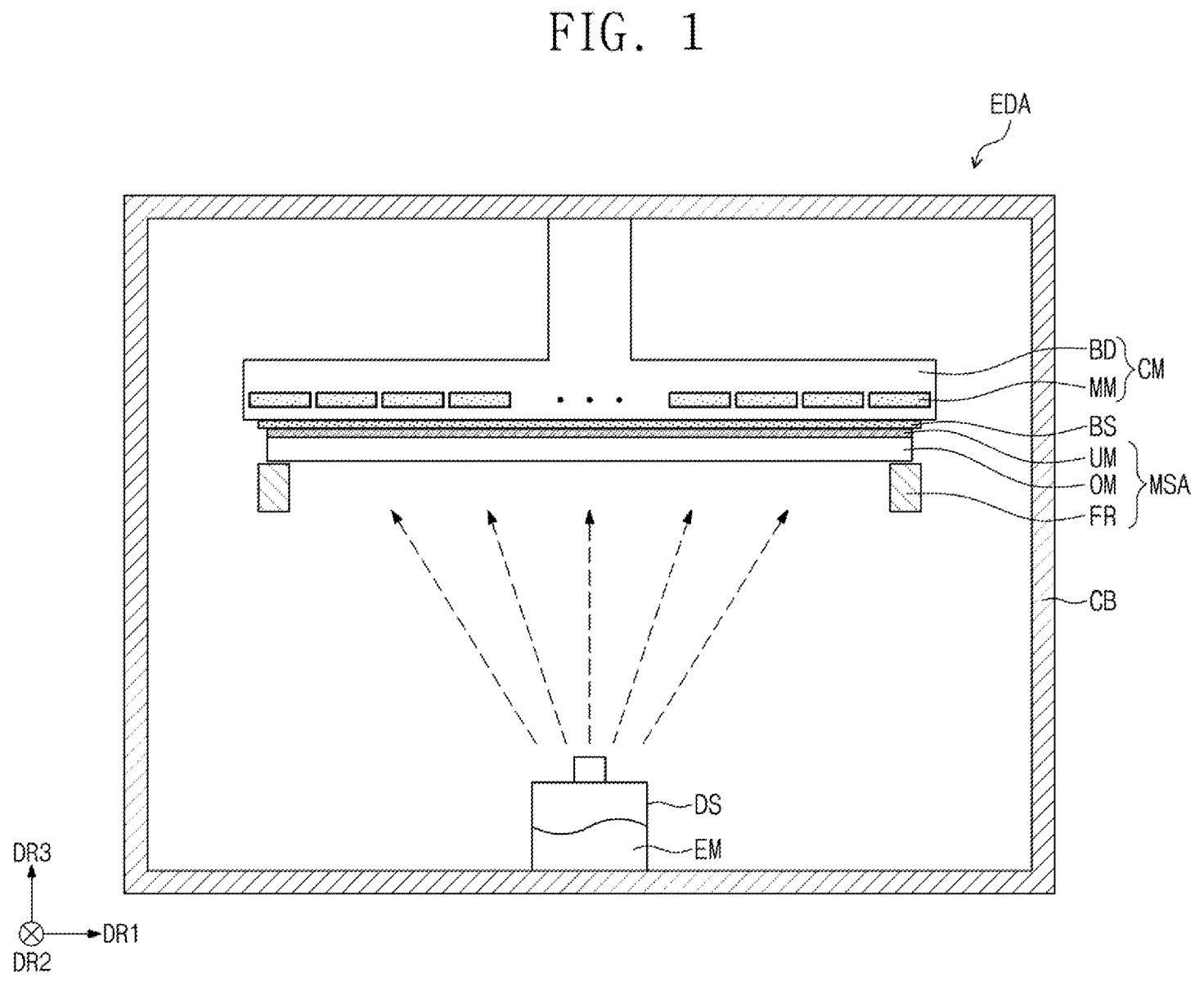

FIG. 1 is a cross-sectional view of an embodiment of a deposition apparatus EDA constructed according to the principles of the invention.

Referring to FIG. 1, the deposition apparatus EDA may include a deposition chamber CB, a fixing member CM, a deposition source DS disposed in the deposition chamber CB, and a mask assembly MSA disposed in the deposition chamber CB. The deposition apparatus EDA may further include additional mechanical apparatus to implement an inline system.

The deposition chamber CB may set a deposition condition to a vacuum state. The deposition chamber CB may include a bottom surface, a ceiling surface, and sidewalls. The bottom surface of the deposition chamber CB may be substantially parallel to a plane defined by a first direction DR1 and a second direction DR2. A third direction DR3 may indicate a normal line direction of the bottom surface of the deposition chamber CB.

The fixing member CM may be disposed in the deposition chamber CB, may be disposed on the deposition source DS, and may fix the mask assembly MSA. The fixing member CM may be installed at the ceiling surface of the deposition chamber CB. The fixing member CM may include a jig or a robot arm to hold the mask assembly MSA.

The fixing member CM may include a body portion BD and magnetic material, which may be in the form of magnetic substances MM, coupled to the body portion BD. The body portion BD may include a plate as a basic structure to fix the mask assembly MSA, however, it should not be particularly limited. The magnetic substances MM may be disposed inside or outside of the body portion BD. The magnetic substances MM may fix the mask assembly MSA using a magnetic force, and thus, a base substrate BS may be tightly adhered to the mask assembly MSA.

The deposition source DS may evaporate a deposition material EM, e.g., a light emitting material, and may spray the evaporated deposition material as a vapor. The sprayed deposition material EM may be deposited on the base substrate BS in a predetermined pattern after passing through the mask assembly MSA. The base substrate BS may correspond to a substrate in an intermediate stage of manufacturing a display panel DP described with reference to FIGS. 11 and 12.

The mask assembly MSA may be disposed in the deposition chamber CB and may be disposed on the deposition source DS. The mask assembly MSA may support the base substrate BS disposed on the mask assembly MSA.

In the illustrated embodiment, the mask assembly MSA may include a frame FR, a first mask, which may be in the form of an open mask OM, and at least one second mask, which may be in the form of at least one mask UM. Each of the masks UM may be a mask that can be deposited in the unit of cell to form one display panel DP. This will be described in detail later.

The base substrate BS may be disposed between the mask assembly MSA and the fixing member CM. The base substrate BS may include a glass substrate or a plastic substrate. The base substrate BS may include a polymer layer disposed on the glass substrate or the plastic substrate. The base substrate BS may be provided as a base surface of a layer formed by the deposition apparatus EDA. Accordingly, the base substrate BS should not be particularly limited as long as the base substrate BS is a component of the display panel DP and is disposed under a component, which is formed by a deposition process, of the display panel DP (refer to FIG. 11) described later. In addition, the base substrate BS may be removed from the display panel DP after a manufacturing process of the display panel DP is completed, however, it should not be particularly limited.

Figure 3:
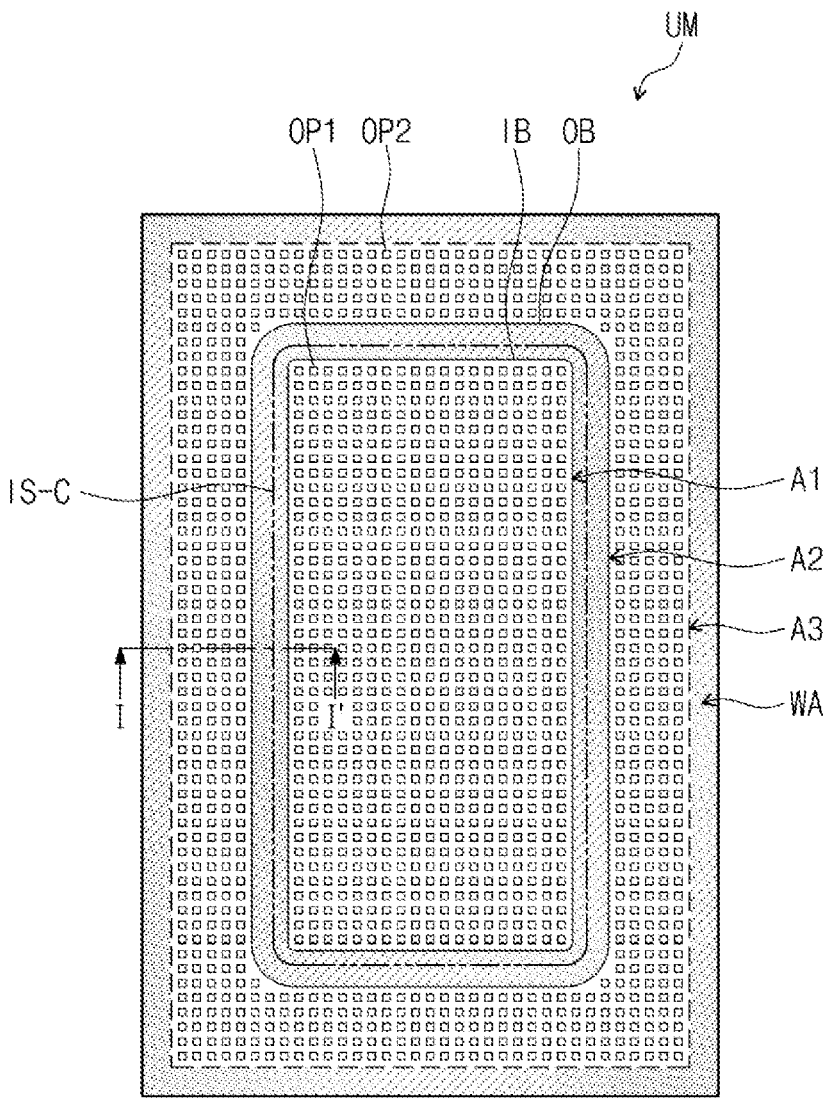
FIG. 3 is a plan view of a first embodiment of the individual masks included in the mask assembly in FIG. 2.
Figure 3:
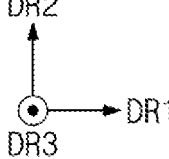
Figure 4A:
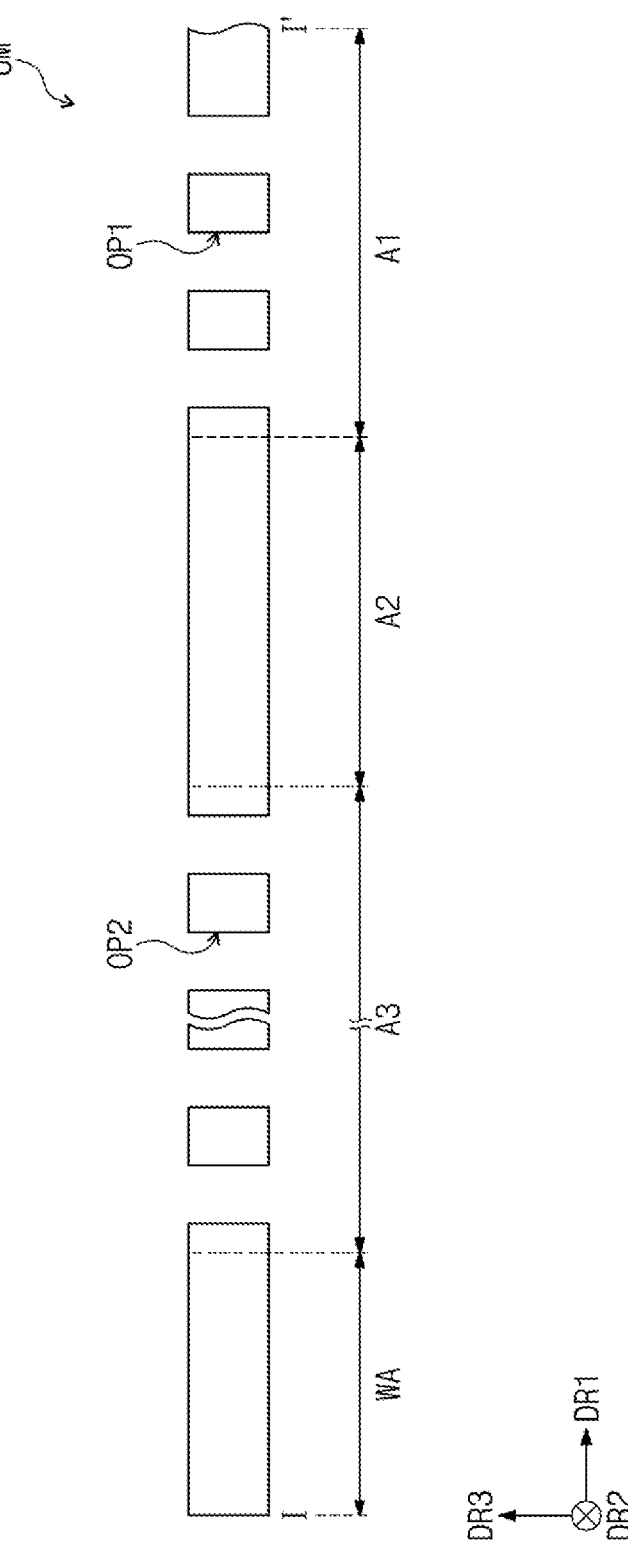
FIG. 4A is a cross-sectional view of an embodiment taken along a line I-I' of FIG. 3.
Figure 4B:
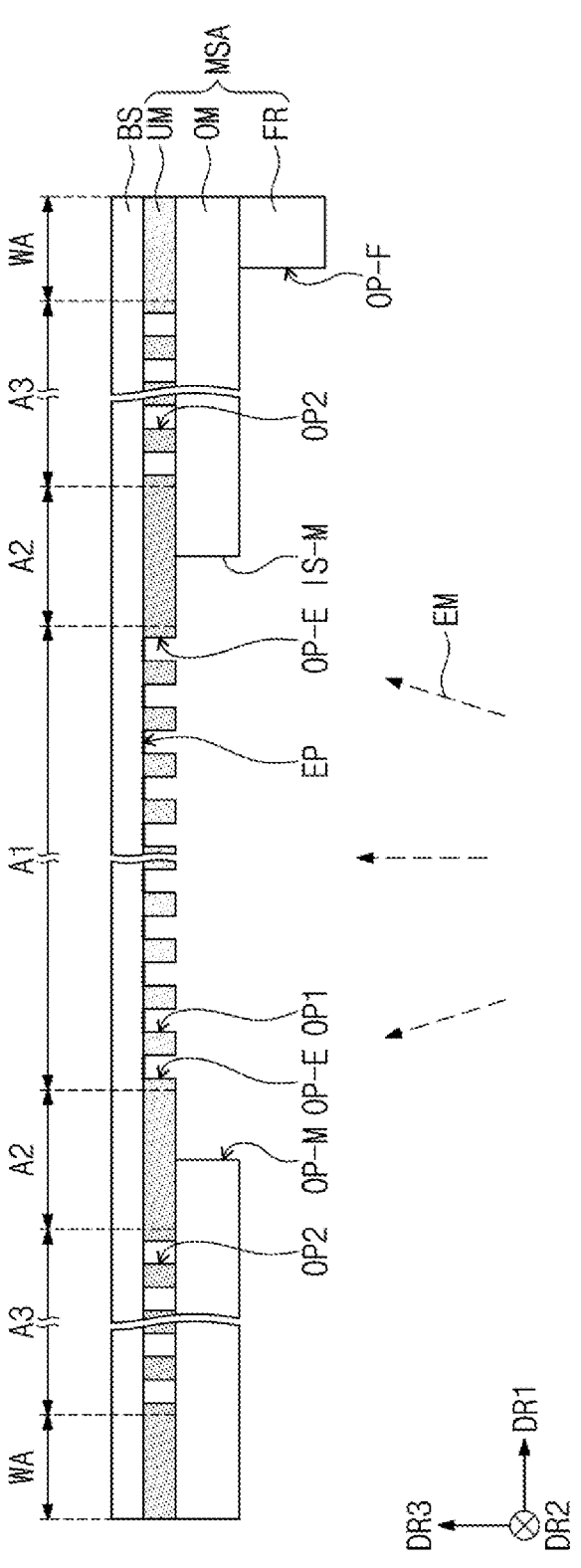
FIG. 4B is a cross-sectional view of an embodiment of a portion of a deposition apparatus of FIG. 1.

FIG. 2 is an exploded perspective view of an embodiment of the mask assembly MSA constructed according to the principles of the invention. FIG. 3 is a plan view of a first embodiment of the individual masks UM included in the mask assembly in FIG. 2. FIG. 4A is a cross-sectional view of an embodiment taken along a line I-I' of FIG. 3, and FIG. 4B is a cross-sectional view of an embodiment of a portion (corresponding to the area including the line I-I' of FIG. 3) of the deposition apparatus of FIG. 1.

Referring to FIG. 2, the mask assembly MSA may include the frame FR, the open mask OM, and the mask UM.

The frame FR may be disposed under the open mask OM and the mask UM and may support the open mask OM and the mask UM.

The frame FR may have a frame opening OP-F. The deposition material EM (refer to FIG. 1) may pass through openings formed through the open mask OM and the mask UM after passing the frame opening OP-F.

An outer surface of the frame FR and an inner surface defining the frame opening OP-F of the frame FR may have a substantially rectangular shape defined by long sides extending in the first direction DR1 and short sides extending in the second direction DR2 when viewed in plan. The shape of the frame FR should not be particularly limited as long as the frame FR may support the open mask OM. In addition, the frame FR may be fixed to the sidewalls of the deposition chamber CB (refer to FIG. 1), and it should not be particularly limited.

In the illustrated embodiment, one frame opening OP-F is formed through the frame FR as a representative example, however, a plurality of frame openings OP-F may be formed through the frame FR, and one open mask OM may be supported by a plurality of frames FR.

The frame FR may include a metal material. The frame FR may include, for example, nickel (Ni), an alloy of nickel and cobalt, an alloy of nickel and iron, or the like.

The open mask OM may be disposed on the frame FR. The open mask OM may have a substantially rectangular shape defined by long sides extending in the first direction DR1 and short sides extending in the second direction DR2.

The open mask OM may have first opening OP-M formed therethrough by removing a portion of the open mask OM in the third direction DR3.

According to an embodiment, a plurality of first openings OP-M may be formed through the open mask OM. The first openings OP-M may be arranged in the first direction DR1 and the second direction DR2. FIG. 2 shows the first openings OP-M arranged in five rows by two columns as a representative example, however, the number and the arrangement of the first openings OP-M should not be limited thereto or thereby.

The first openings OP-M may be exposed by the frame opening OP-F without being covered by the frame FR. Accordingly, the deposition material EM (refer to FIG. 1) sprayed by the deposition source DS may be provided to the first openings OP-M without the frame FR interfering with the vapor being sprayed from the deposition source DS.

Referring to FIG. 2, a plurality of inner surfaces IS-M may be included in one open mask OM to define a corresponding first opening among the first openings OP-M. The plurality of inner surfaces IS-M may include short side surfaces extending in the first direction DR1 and long side surfaces extending from the short sides in the second direction DR2. Corners where the long side meets the short side may have a rounded shape or a shape with a predetermined curvature.

The open mask OM may include a metal material. According to an embodiment, the open mask OM may include at least one of stainless steel, Invar, nickel, cobalt, an alloy of nickel, and an alloy of nickel and cobalt.

The mask UM may be disposed on the open mask OM. According to an embodiment, the mask UM may be provided in plural. The masks UM may be disposed to correspond to the first openings OP-M. That is, each of the masks UM may be disposed to overlap a corresponding opening among the first openings OP-M.

Accordingly, the masks UM may be arranged in the first direction DR1 and the second direction DR2. In FIG. 2, the masks UM are arranged in five rows by two columns, however, the number and the arrangement of the masks UM should not be particularly limited.

Each of the masks UM may include a metal material. According to an embodiment, each of the masks UM may include at least one of stainless steel, Invar, nickel, cobalt, an alloy of nickel, and an alloy of nickel and cobalt.

According to the illustrated embodiment, each of the masks UM may include a deposition area A1, an inner area, which may be in the form of a margin area A2, an outer area, which may be in the form of a peripheral area A3, and an outermost area, which may be in the form of a welding area WA.

The deposition area A1 may be disposed at a center of the mask UM. The deposition area A1 may overlap the first opening OP-M. In the illustrated embodiment, the deposition area A1 may be an area through which the vapor sprayed by the deposition source DS (refer to FIG. 1) passes. Accordingly, the deposition area A1 may correspond to an area of the base substrate BS (refer to FIG. 1) onto which the deposition material EM (refer to FIG. 1) is deposited by the deposition process.

The margin area A2 may surround the deposition area A1. In the illustrated embodiment, the inner surface IS-M of the open mask OM, which defines the first opening OP-M, may be located in the margin area A2 when viewed in plan.

The peripheral area A3 may surround the margin area A2.

According to an embodiment, the margin area A2 and the peripheral area A3 may be areas through which the deposition material EM (refer to FIG. 1) does not pass. The deposition area A1, the margin area A2, and the peripheral area A3 will be described in detail later.

The welding area WA may surround the peripheral area A3. The welding area WA may be disposed at an outermost position of the mask UM. The welding area WA may be a portion coupled to the open mask OM.

In the process of manufacturing the mask assembly MSA, each of the masks UM may be stretched in the first direction DR1 and the second direction DR2 after being aligned with a corresponding opening of the first openings OP-M and may be welded to the open mask OM. According to an embodiment, a welding process may be carried out by irradiating a laser beam onto the mask UM.

FIG. 3 is a plan view of the mask UM when looking at a front surface of the mask UM. In FIG. 3, the inner surface IS-M that defines the first opening OP-M (refer to FIG. 2) of the open mask OM is illustrated by a dash double-dotted line IS-C, which defines the outer boundary of the opening OP-M.

Referring to FIGS. 3 and 4, the mask UM may include the deposition area A1, the margin area A2 surrounding the deposition area A1, the peripheral area A3 surrounding the margin area A2, and the welding area WA surrounding the peripheral area A3.

In the deposition area A1, second openings (i.e., deposition openings) OP1 may be formed through the mask UM in the third direction DR3. The deposition openings OP1 may be arranged in the first direction DR1 and the second direction DR2 when viewed in plan. However, the arrangement direction of the deposition openings OP1 should not be limited thereto or thereby.

Each of the deposition openings OP1 may have a substantially square shape when viewed in plan, however, the shape of the deposition openings OP1 should not be limited thereto or thereby. As an example, each of the deposition openings OP1 may have a lozenge shape. Some of the deposition openings OP1 formed in an area adjacent to the margin area A2 may have different size and shape from other deposition openings OP1 placed in the inside of the deposition area A1.

The margin area A2 may be an area through which no openings are formed in the third direction DR3 as shown in FIGS. 3 and 4A.

According to the illustrated embodiment, referring to FIG. 3, a boundary line IS-C corresponding to the inner surface IS-M of the open mask OM, which defines the first opening OP-M, may overlap the margin area A2. That is, the boundary line IS-C which defines the first opening OP-M may be located in the margin area A2. Accordingly, a portion of the margin area A2 and the deposition area A1 may overlap the first opening OP-M, and the other portion of the margin area A2 may be covered by the open mask OM.

Since the margin area A2 does not have any openings, the inner surface IS-M of the open mask OM may not be exposed by the margin area A2 when looking at the front surface of the mask UM in direction DR3.

In the peripheral area A3, third openings (i.e., peripheral openings) OP2 may be formed through the mask UM in the third direction DR3. The peripheral openings OP2 may surround the margin area A2.

The peripheral openings OP2 may be arranged in the first direction DR1 and the second direction DR2 when viewed in plan, however, the arrangement direction of the peripheral openings OP2 should not be limited thereto or thereby.

Each of the peripheral openings OP2 may have a substantially square shape when viewed in plan, however, the shape of the peripheral openings OP2 should not be limited thereto or thereby. As an example, some of the peripheral openings OP2 formed in an area adjacent to the margin area A2 may have different size and shape from other peripheral openings OP2 disposed in the inside of the peripheral area A3.

According to an embodiment, the shape of the peripheral openings OP2 may be substantially the same as the shape of the deposition openings OP1 when viewed in plan. In addition, the size of each of the peripheral openings OP2 may be substantially the same as the size of each of the deposition openings OP1, however, it should not be limited thereto or thereby. According to an embodiment, the peripheral openings OP2 may have different shape and size from those of the deposition openings OP1. This will be described in detail later.

The welding area WA may be an area through which no openings are formed in the third direction DR3 as shown in FIGS. 3 and 4A.

In the illustrated embodiment, a boundary surface between the deposition area A1 and the margin area A2 of the mask UM is referred to as a first inner boundary line IB, and a boundary surface between the margin area A2 and the peripheral area A3 is referred to as a second outer boundary line OB when viewed in plan. In FIG. 3, each of the first boundary line IB and the second boundary line OB is illustrated by a solid line.

According to an embodiment, the first boundary line IB may have a substantially rectangular shape defined by long sides extending in the second direction DR2 and short sides extending in the first direction DR1 when viewed in plan. Corners where the long side meets the short side may have a rounded shape or a shape with a predetermined curvature. However, the shape of the first boundary line IB should not be limited thereto or thereby and may be changed depending on the shape of the display panel DP (refer to FIG. 11) to be deposited.

According to an embodiment, the second boundary line OB may have a substantially rectangular shape defined by long sides extending in the second direction DR2 and short sides extending in the first direction DR1 when viewed in plan. Corners where the long side meets the short side may have a rounded shape or a shape with a predetermined curvature. According to an embodiment, the second boundary line OB may have a shape surrounding the first boundary line IB while maintaining a predetermined width. Accordingly, the margin area A2 may have a closed-line shape surrounding the deposition area A1 when viewed in plan. However, the shape of the second boundary line OB should not be limited thereto or thereby and may have a shape different from that of the first boundary line IB.

According to an embodiment, the margin area A2 may have a width between about 200 micrometers and about 500 micrometers. In a case where the width of the margin area A2 is smaller than about 200 micrometers, the margin area A2 of the mask UM may be insufficient to fully overlap the inner surface IS-M of the open mask OM, and deposition patterns EP (refer to FIG. 4B) described later may be deposited in an area other than the area in which light emitting patterns are provided.

In a case where the width of the margin area A2 is greater than about 500 micrometers, the area where the openings are not formed may increase, a repulsive force may occur between the margin area A2 and the magnetic substance MM (refer to FIG. 1), and thus, an adhesive force between the mask assembly MSA and the base substrate BS may be reduced. The adhesive force between the mask assembly MSA and the base substrate BS will be described in detail later.

FIG. 4B shows a cross-section of the mask assembly MSA and the base substrate BS disposed on the mask assembly MSA. The cross-section shown in FIG. 4B may correspond to a cross-section of one of the individual masks among the masks UM included in the mask assembly MSA shown in FIG. 2. In addition, in FIG. 4B, the deposition material EM sprayed from the deposition source DS (refer to FIG. 1) is illustrated by an arrow.

The mask assembly MSA may include the frame FR, the open mask OM disposed on the frame FR, and the mask UM disposed on the open mask OM. The mask UM shown in FIG. 4B may correspond to the mask UM described with reference to FIGS. 3 and 4A.

According to an embodiment, substantially the entire deposition area A1 of the mask UM may overlap the first opening OP-M formed through the open mask OM in the third direction DR3. That is, all the deposition openings OP1 formed in the deposition area A1 may overlap the first opening OP-M. The entire deposition area A1 may be exposed through the first opening OP-M without being covered by the open mask OM.

In addition, the base substrate BS may be exposed through the deposition openings OP1 without being covered by the mask UM. That is, an area of the base substrate BS, which overlaps the deposition openings OP1, may be exposed without being covered by the mask UM and the open mask OM. Accordingly, the deposition material EM may be deposited on the base substrate BS after passing through the first opening OP-M and the deposition openings OP1 of the mask assembly MSA.

According to an embodiment, a portion of the margin area A2 may overlap the first opening OP-M when viewed in the third direction DR3. Accordingly, the portion of the margin area A2 may be exposed through the first opening OP-M formed through the open mask OM.

However, since no openings are formed through the mask UM in the margin area A2, an area of the base substrate BS, which overlaps the margin area A2, may be entirely covered by the mask UM when viewed from a rear side of the open mask OM. Accordingly, the deposition material EM may not pass through the margin area A2 of the mask UM, and thus, the deposition material EM may not be deposited on the area of the base substrate BS, which overlaps the margin area A2.

According to an embodiment, areas of the base substrate BS on which the deposition material EM is deposited may overlap the deposition openings OP1 when viewed in plan. In the illustrated embodiment, the areas of the base substrate BS on which the deposition material EM is deposited are referred to as the deposition patterns EP.

According to the illustrated embodiment, the deposition patterns EP may respectively correspond to the deposition openings OP1 formed in the deposition area A1. Accordingly, the deposition patterns disposed at outermost positions among the deposition patterns EP may be formed by openings OP-E (hereinafter, referred to as outermost openings) disposed at outermost positions adjacent to the margin area A2 among the deposition openings OP1.

On the other hand, in the related art, in a case where the deposition openings OP1 are formed in the entire area of the mask UM overlapping the first opening OP-M, since the deposition material may pass through the deposition openings located in the region overlapping the first opening OP-M, the deposition openings OP1 through which the deposition material EM passes may be determined by the first opening OP-M.

As the manufacturing process of the open mask OM is performed over a large area, a process tolerance of the first opening OP-M may occur due to the manufacturing tolerance of the open mask OM. When the process tolerance occurs in the first opening OP-M, the deposition patterns EP formed in the base substrate BS may be different from predetermined deposition patterns (hereinafter, referred to as light emitting patterns). Accordingly, the deposition patterns EP may be formed with errors in alignment with respect to the light emitting patterns due to the process tolerance of the first opening OP-M.

In this case, the dead space of the display panel DP (refer to FIG. 11) may have a width determined by the errors between the deposition patterns EP and the light emitting patterns. Accordingly, in the case where the deposition patterns EP are defined by the first opening OP-M, the precision of the deposition patterns EP is low, so there is a limit to reducing the width of the dead space of the display panel DP.

However, in an open mask OM constructed according to the principles and illustrated embodiments of the invention, since the mask UM is manufactured in the unit of a cell of the display panel DP, the precision in manufacturing of the mask UM may be higher than the precision in manufacturing of the open mask OM. In detail, the process tolerance of the deposition openings OP1 may be about 10% of the process tolerance of the first opening OP-M.

Specifically, as described herein as the mask UM includes the margin area A2 in which no openings are formed and the inner surface IS-M defining the first opening OP-M overlaps the margin area A2, the positions at which the deposition patterns EP are formed may be determined by the deposition openings OP1 of the mask UM and may not be affected by the process tolerance of the first opening OP-M. Accordingly, the mask UM that increases the precision of the deposition patterns EP may be provided, and thus, the width of the dead space of the display panel DP (refer to FIG. 11) may be reduced.

According to the illustrated embodiment, the width of the margin area A2 in plan may be defined as the minimum distance between the first boundary line IB (refer to FIG. 3) and the second boundary line OB (refer to FIG. 3), and the position of the first boundary line IB and the position of the second boundary line OB may be determined by the process tolerance of the first opening OP-M.

For example, the first boundary line IB may be disposed inside the inner surface IS-M of the opening having the smallest size among the first openings OP-M formed through one open mask OM described with reference to FIG. 2 or may be disposed to align with the inner surface IS-M of the opening having the smallest size among the first openings OP-M formed through one open mask OM.

Also, the second boundary line OB may be disposed outside the inner surface IS-M of the opening having the largest size among the first openings OP-M formed through one open mask OM described with reference to FIG. 2 or may be disposed to align with the inner surface IS-M of the opening having the largest size among the first openings OP-M formed through one open mask OM.

Accordingly, even though the first openings OP-M having different sizes are formed through one open mask OM due to the process tolerance, the inner surface IS-M defining the first opening OP-M may entirely overlap the margin area A2 when viewed in plan.

Accordingly, the open mask OM may be prevented from covering the portion of the deposition area A1, and thus, the portion in which the deposition material EM is not deposited may be prevented from being formed in the area of the base substrate BS, which overlaps the deposition openings OP1. In addition, the portion of the peripheral area A3 may be prevented from being exposed through the first opening OP-M without being covered by the open mask OM, and thus, decrease in the deposition reliability, which is caused by the deposition material ET deposited in a region other than the preset region within the base substrate BS, may be reduced or prevented.

According to an embodiment, the entire peripheral area A3 may not overlap the first opening OP-M in the third direction DR3. The peripheral area A3 may be covered by the open mask OM when viewed from the rear side of the open mask OM. That is, all the peripheral openings OP2 formed in the peripheral area A3 may be covered by the open mask OM. Accordingly, the deposition material EM may not pass through the peripheral area A3 of the mask UM, and thus, the deposition material EM may not be deposited in the area of the base substrate BS, which overlaps the peripheral area A3.

When a space is formed between the mask assembly MSA and the base substrate BS because they are not in close contact with each other, a shadow area in which the deposition material EM is insufficiently deposited may occur in area adjacent to the inner surface of the deposition area A1 defining the deposition openings OP1.

The peripheral area A3 may prevent the repulsive force from being generated between the mask assembly MSA and the magnetic substance MM (refer to FIG. 1) by defining the peripheral openings OP2 with a certain pattern to the mask UM. Accordingly, a coupling force between the base substrate BS and the mask assembly MSA may increase.

According to the illustrated embodiment, the repulsive force generated between the mask assembly MSA and the magnetic substance MM may decrease, and the adhesive force between the mask assembly MSA and the base substrate BS may increase. Accordingly, the shadow area may be reduced, the precision of each of the deposition patterns EP may increase, and the display quality of the display panel DP (refer to FIG. 11) may be improved.

Figure 5:
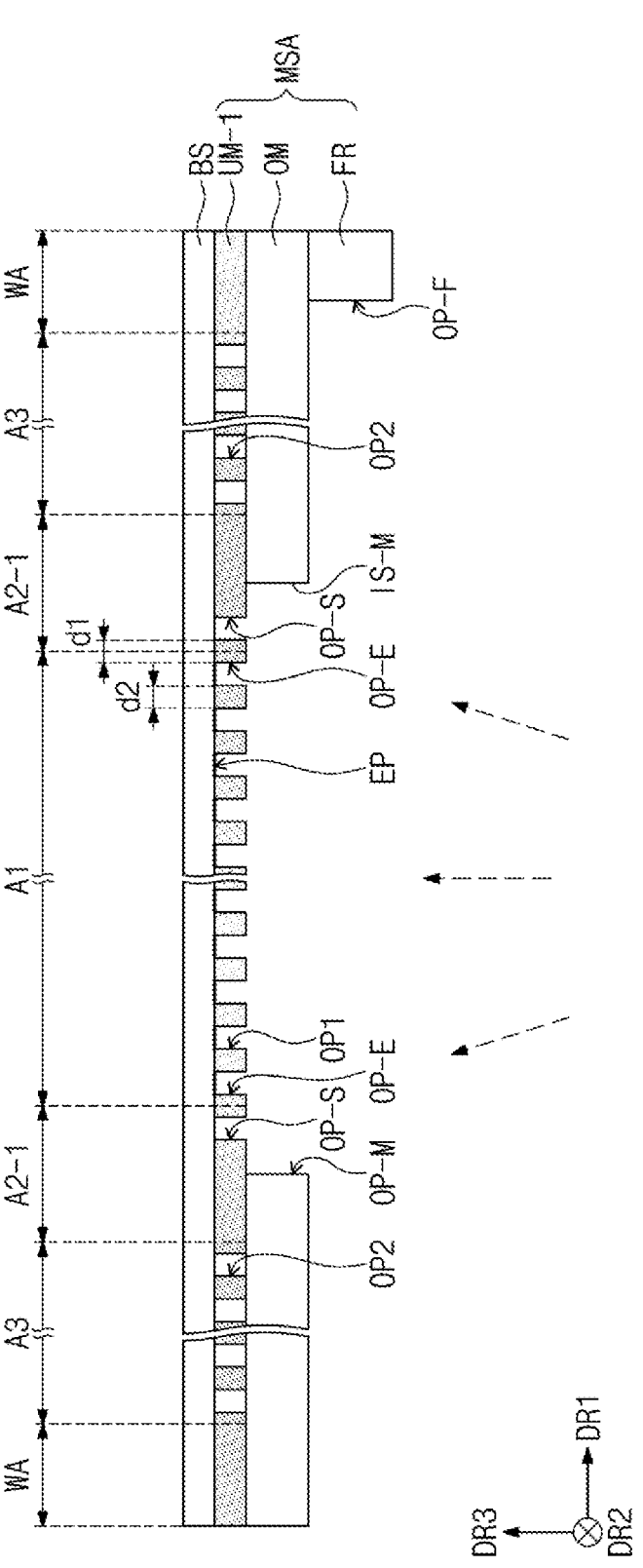
FIG. 5 is a cross-sectional view of another embodiment of a portion of a deposition apparatus of FIG. 1.

FIG. 5 is a cross-sectional view of a portion of another embodiment of a deposition apparatus of FIG. 1. Compared with the embodiment of FIG. 4B, there is a difference in that sub-openings OP-S are formed in the margin area A2-1. In FIG. 5, the same/similar reference numerals denote the same/similar elements in FIGS. 1 to 4B, and thus, detailed descriptions of the same/similar elements will be omitted to avoid redundancy.

Referring to FIG. 5, a mask assembly MSA may include a frame FR, an open mask OM, and a mask UM-1. The mask UM-1 may include a deposition area A1, a margin area A2-1, a peripheral area A3, and a welding area WA.

According to an embodiment, sub-openings OP-S may be formed through the mask UM-1 along the third direction DR3 in the margin area A2-1. The sub-openings OP-S may surround outermost openings OP-E adjacent to the margin area A2-1 among deposition openings OP1.

Each of the sub-openings OP-S may be spaced apart from one outermost opening adjacent thereto among the outermost openings OP-E in the first direction DR1. In this case, the separation distance d1 between the outermost opening OP-E and the sub-opening OP-S adjacent to the outermost opening OP-E may be substantially the same as the separation distance d2 between the deposition openings OP1.

However, the illustrated embodiment should not be limited thereto or thereby, and two sub-openings OP-S arranged in the first direction DR1 may be spaced apart from the outermost opening OP-E in the first direction DR1 or a direction opposite to the first direction DR1.

The sub-openings OP-S may have substantially the same shape as that of the deposition openings OP1 formed in the deposition area A1. In addition, the separation distance between the sub-openings adjacent to each other among the sub-openings OP-S may be substantially the same as the separation distance d2 between the deposition openings adjacent to each other among the deposition openings OP1.

When the mask UM-1 is patterned, the etching accuracy of the outermost openings OP-E among the deposition openings OP1 included in the deposition area A1 may be slightly lower than the etching accuracy of the deposition openings OP1 disposed inside the deposition area A1.

According to the illustrated embodiment, as the sub-openings OP-S are formed to surround the outermost openings OP-E, the outermost openings OP-E may be etched at a substantially uniform etching accuracy with the deposition openings OP1 placed inside the deposition area A1. Therefore, the deposition openings OP1 formed in the deposition area A1 may be patterned under a substantially uniform condition regardless of positions thereof. Accordingly, the reliability of the mask UM-1 may be improved.

In FIG. 5, the sub-openings OP-S of the margin area A2-1 are described as being formed through the mask UM-1 in the third direction DR3, however, they should not be limited thereto or thereby. According to an embodiment, at least one of the sub-openings OP-S may be provided in a groove shape obtained by removing a portion of the mask UM-1 along the third direction DR3.

Figure 6:
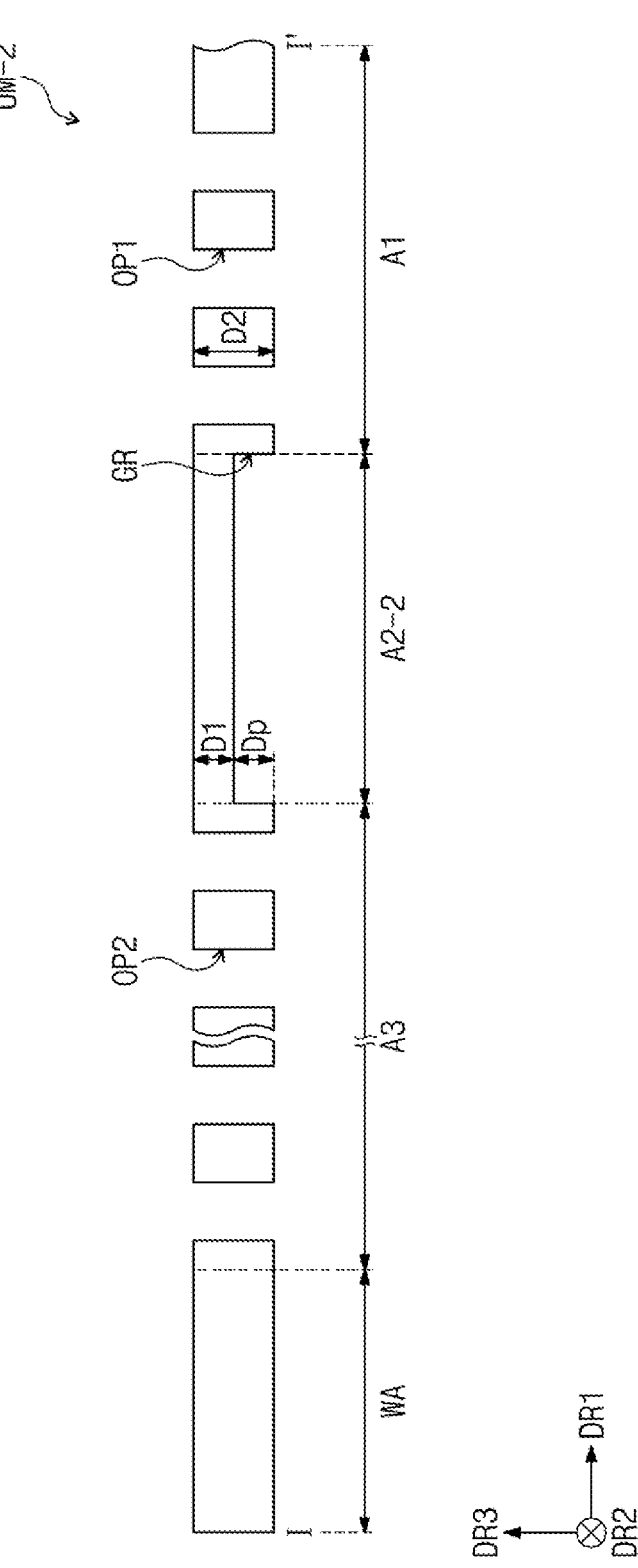
FIG. 6 is a cross-sectional view of another embodiment taken along a line I-I' of FIG. 3.

FIG. 6 is a cross-sectional view of another embodiment taken along a line I-I' of FIG. 3. Compared with the embodiment of FIG. 4A, there is a difference in that a margin groove GR is formed in the margin area A2-2. In FIG. 6, the same/similar reference numerals denote the same/similar elements in FIGS. 1 to 4B, and thus, detailed descriptions of the same/similar elements will be omitted to avoid redundancy.

Referring to FIG. 6, a mask UM-2 may include a deposition area A1, a margin area A2-2, a peripheral area A3, and a welding area WA.

According to an embodiment, a margin groove GR formed by removing a portion of the mask UM-2 along the third direction DR3 may be formed in the margin area A2-2. As an example, the margin groove GR may be formed by removing the portion of the mask UM-2 from a rear surface of the mask UM-2 in an upward direction.

According to an embodiment, the depth Dp of the margin groove GR may be substantially constant over the entire area of the margin area A2-2, however, it should not be particularly limited. According to an embodiment, the depth Dp of the margin groove GR may be changed depending on positions in the margin area A2-2.

According to an embodiment, the margin groove GR may be formed in the mask UM-2 over the entire margin area A2-2, however, it should not be limited thereto or thereby. According to an embodiment, the margin groove GR may be formed in the mask UM-2 in a portion of the margin area A2-2, or a plurality of margin grooves GR may be formed in the mask UM-2 in the margin area A2-2.

According to an embodiment, the thickness D1 of the mask UM-2 in the margin area A2-2 may be smaller than a thickness D2 of the mask UM-2 in the deposition area A1. Accordingly, although the tensile force is applied to the mask UM-2 in the first direction DR1 and the second direction DR2 to weld the mask UM-2 to the open mask OM (refer to FIG. 2), the mask UM-2 may be prevented from being damaged due to the tensile force.

Figure 7A:
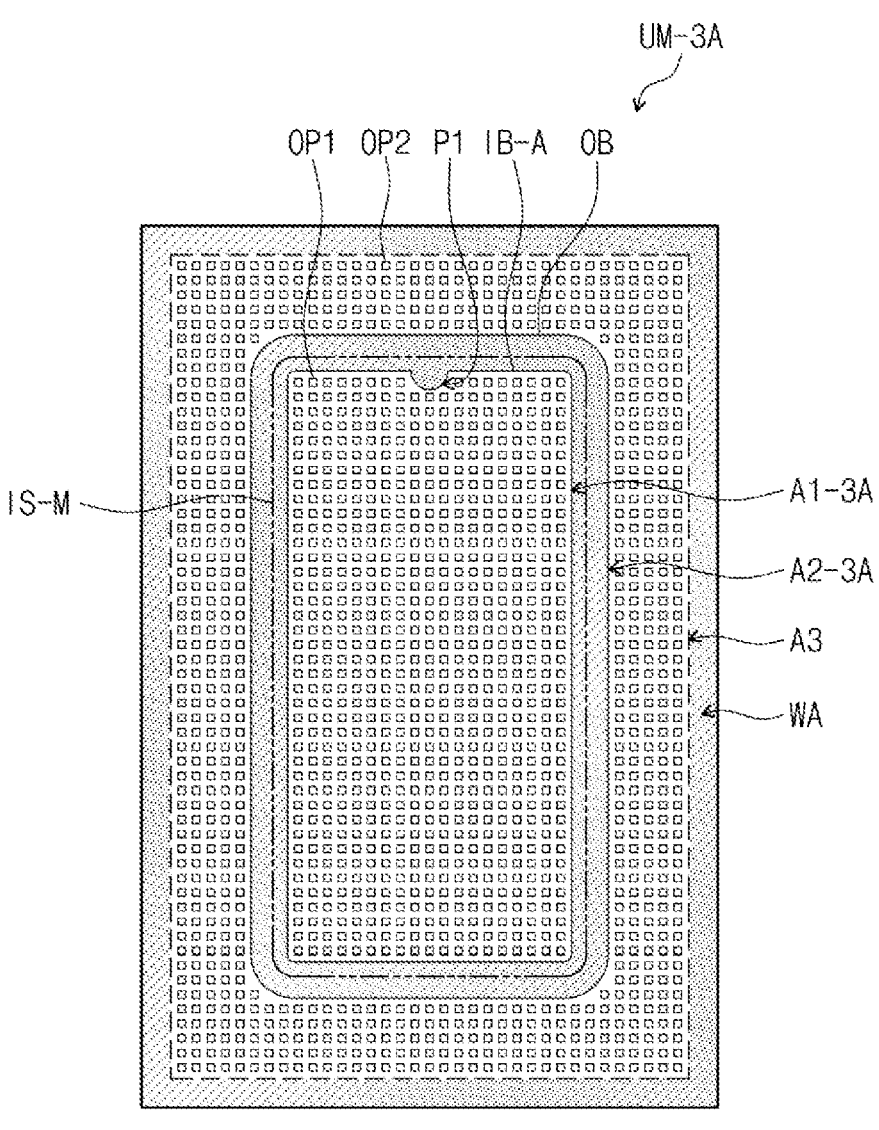
FIG. 7A is a plan view of a second embodiment of the individual masks included in the mask assembly in FIG. 2.
Figure 7B:
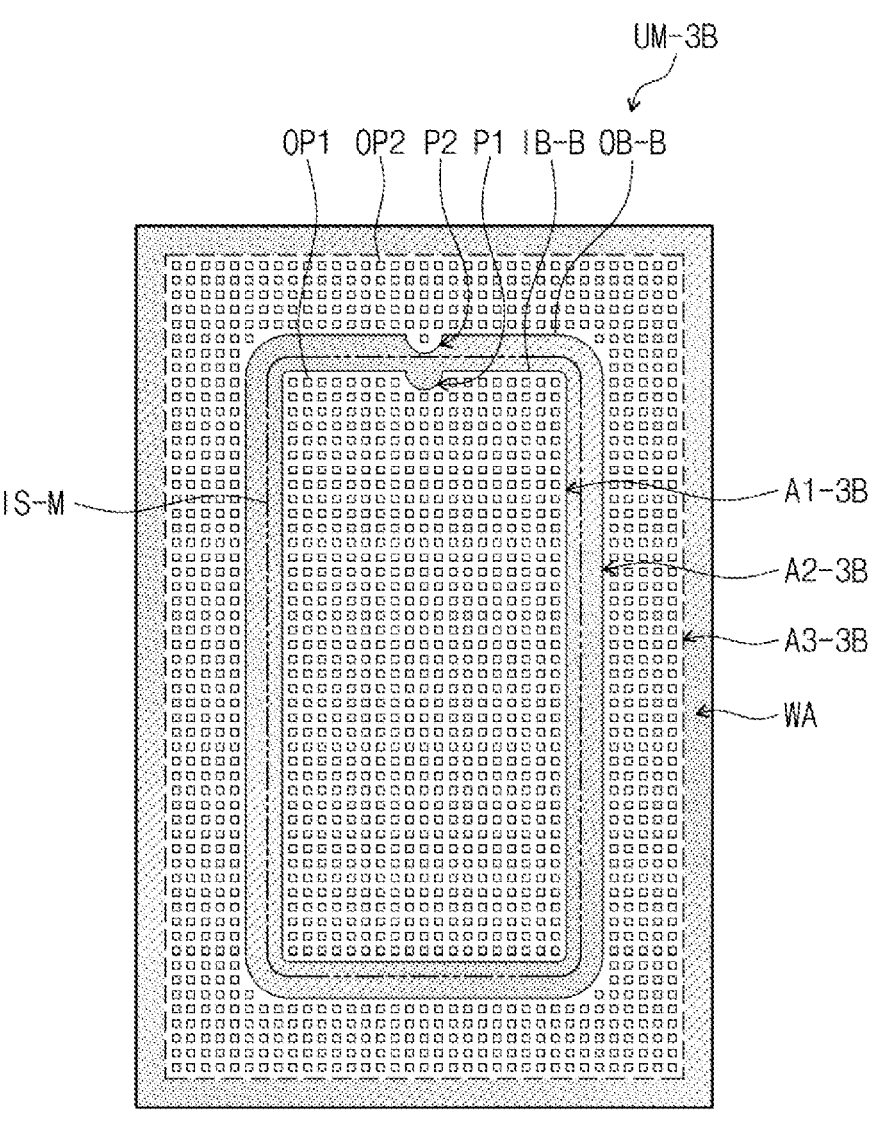
FIG. 7B is a plan view of a third embodiment of the individual masks included in the mask assembly in FIG. 2.

FIG. 7A is a plan view of a second embodiment of the individual masks UM-3A included in the mask assembly in FIG. 2. FIG. 7B is a plan view of a third embodiment of the individual masks UM-3B included in the mask assembly in FIG. 2. In FIGS. 7A and 7B, the same/similar reference numerals denote the same/similar elements in FIGS. 1 to 4B, and thus, detailed descriptions of the same/similar elements will be omitted to avoid redundancy.

Referring to FIG. 7A, the mask UM-3A may include a deposition area A1-3A, a margin area A2-3A, a peripheral area A3, and a welding area WA. In the illustrated embodiment, a first boundary line IB-A may be a boundary surface at which the deposition area A1-3A is in contact with the margin area A2-3A.

The first boundary line IB-A may include a portion P1 (hereinafter, referred to as a first protruding portion) projecting toward the deposition area A1-3A when viewed in plan. That is, a portion of the margin area A2-3A may include a projecting portion when viewed in plan.

Therefore, the deposition material EM (refer to FIG. 1) may not pass through the projecting portion of the margin area A2-3A. Accordingly, in a case where a deposition process is performed on the display panel DP (refer to FIG. 11) using the mask UM-3A, a display area DA (refer to FIG. 11) may have a recessed portion when viewed in plan. An electronic module may be disposed in the recessed portion.

According to an embodiment, the first protruding portion P1 of the first boundary line IB-A may have a semicircular shape when viewed in plan, however, the shape of the first boundary line IB-A should not be particularly limited.

Referring to FIG. 7B, the mask UM-3B may include a deposition area A1-3B, a margin area A2-3B, a peripheral area A3-3B, and a welding area WA. In the illustrated embodiment, a first boundary line IB-B may be a boundary surface at which the deposition area A1-3B is in contact with the margin area A2-3B. A second boundary line OB-B may be a boundary surface at which the margin area A2-3B is in contact with the peripheral area A3-3B.

The first boundary line IB-B may include a portion P1 (hereinafter, referred to as a first protruding portion) projecting toward the deposition area A1-3B when viewed in plan. The second boundary line OB-B may include a portion P2 (hereinafter, referred to as a second protruding portion) projecting toward the deposition area A1-3B when viewed in plan.

According to an embodiment, the second protruding portion P2 of the second boundary line OB-B may correspond to the first protruding portion P1 of the first boundary line IB-B. As an example, the second protruding portion P2 of the second boundary line OB-B and the first protruding portion P1 of the first boundary line IB-B may be arranged in substantially the same direction and may have substantially the same shape.

According to an embodiment, in a case where the first boundary line IB-B includes the first protruding portion P1, the second boundary line OB-B may include the second protruding portion P2 corresponding to the first protruding portion P1. Accordingly, the width of a portion in which an opening is not formed may not increase in the mask UM-3B. That is, a portion of the margin area A2-3B may include a recessed portion when viewed in plan, and a portion of the peripheral area A3-3B may include a portion projecting as much as the recessed portion of the margin area A2-3B.

Accordingly, the repulsive force may be reduced between the mask assembly MSA (refer to FIG. 1) and the magnetic substance MM (refer to FIG. 1), and the deterioration of the deposition precision due to the separation between the mask assembly MSA and the base substrate BS (refer to FIG. 1) may be prevented.

Figure 8:
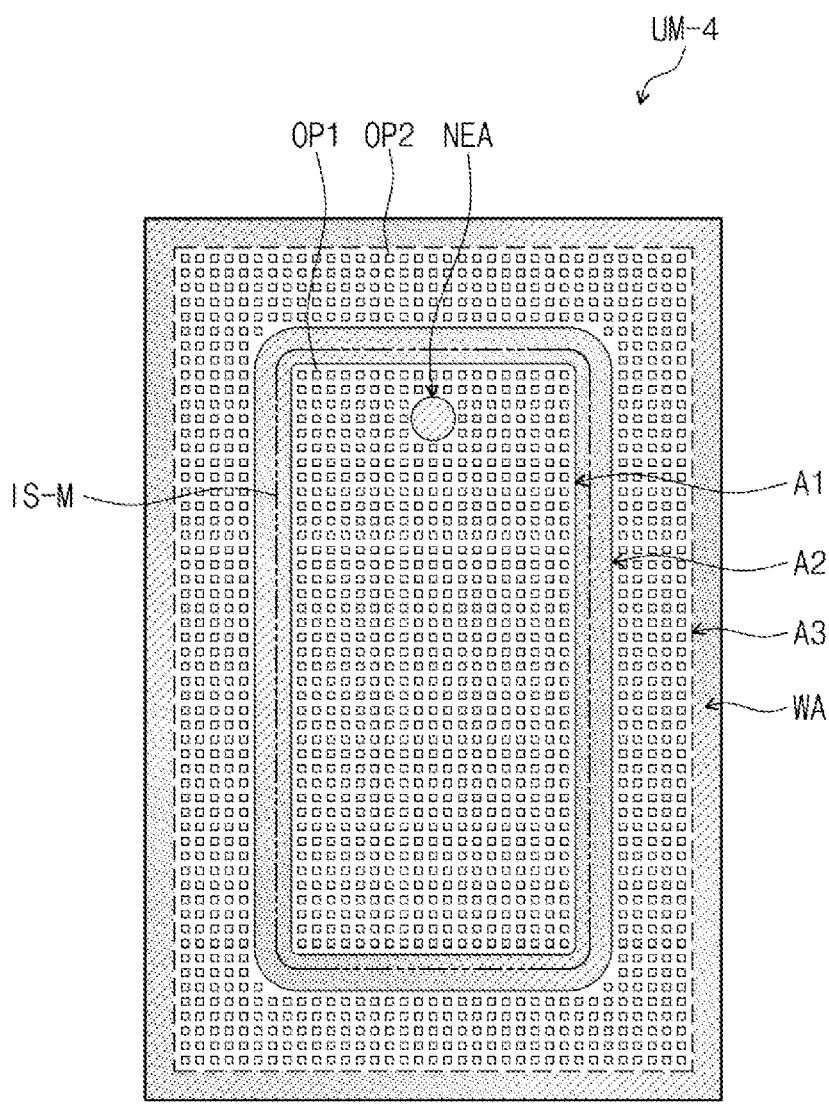
FIG. 8 is a plan view of a fourth embodiment of the individual masks included in the mask assembly in FIG. 2.
Figure 8:
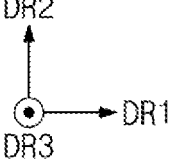

FIG. 8 is a plan view of a fourth embodiment of the individual masks UM-4 included in the mask assembly in FIG. 2. In FIG. 8, the same/similar reference numerals denote the same/similar elements in FIGS. 1 to 4B, and thus, detailed descriptions of the same/similar elements will be omitted to avoid redundancy.

Referring to FIG. 8, the mask UM-4 may include a deposition area A1, a margin area A2, a peripheral area A3, and a welding area WA. The mask UM-4 may further include a non-deposition area NEA surrounded by the deposition area A1.

The non-deposition area NEA may be an area through which an opening is not formed in the third direction DR3. Accordingly, the deposition material EM (refer to FIG. 1) may not pass through the non-deposition area NEA.

When the mask UM-4 is used, a non-display area NDA (refer to FIG. 11) surrounded by the display area DA (refer to FIG. 11) may be provided. An electronic module may be disposed in the non-display area NDA (refer to FIG. 11).

According to an embodiment, the non-deposition area NEA may have a circular shape when viewed in plan, however, the shape of the non-deposition area NEA should not be particularly limited. As an example, the non-deposition area NEA may have a variety of shapes, such as an oval shape, a polygonal shape, etc., when viewed in plan.

Figure 9:
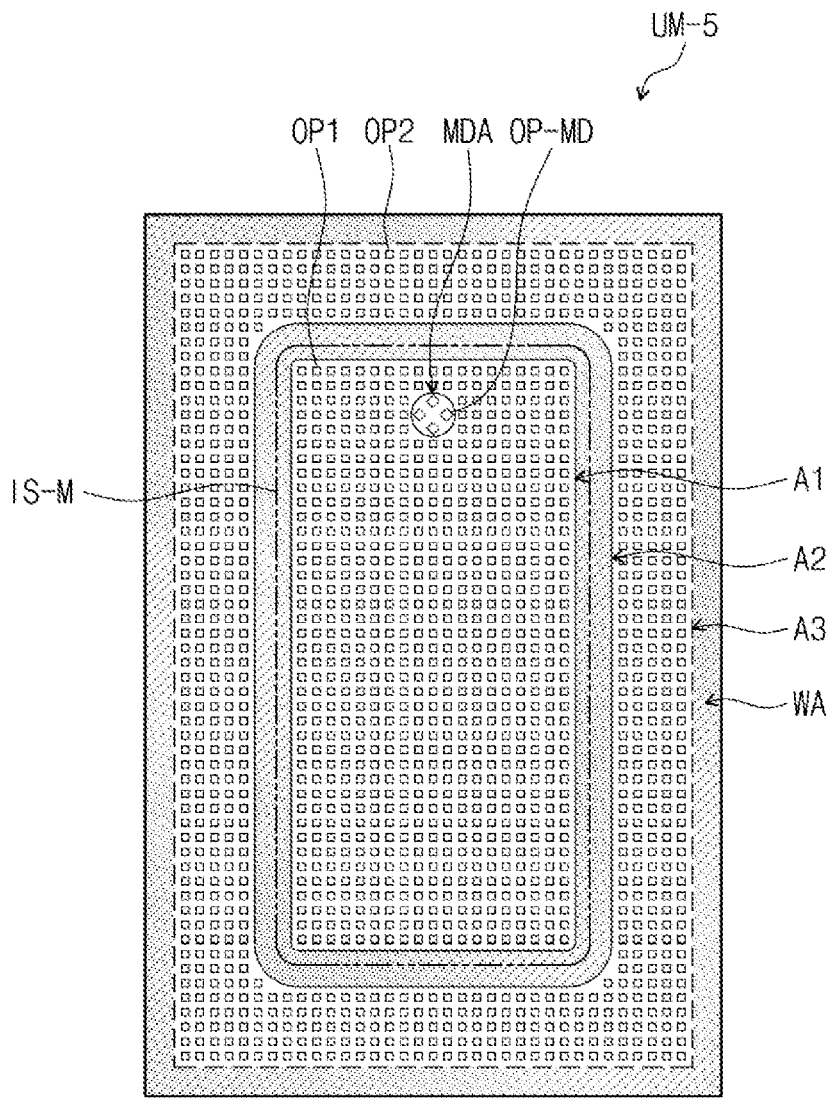
FIG. 9 is a plan view of a fifth embodiment of the individual masks included in the mask assembly in FIG. 2.
Figure 9:
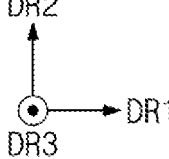

FIG. 9 is a plan view of a fifth embodiment of the individual masks UM-5 included in the mask assembly in FIG. 2. In FIG. 9, the same/similar reference numerals denote the same/similar elements in FIGS. 1 to 4B, and thus, detailed descriptions of the same/similar elements will be omitted to avoid redundancy.

Referring to FIG. 9, the mask UM-5 may include a deposition area A1, a margin area A2, a peripheral area A3, and a welding area WA. The mask UM-5 may further include a module area MDA surrounded by the deposition area A1.

In the module area MDA, module openings OP-MD may be formed through the mask UM-5 in the third direction DR3.

According to an embodiment, the module openings OP-MD may have a shape different from that of deposition openings OP1. As shown in FIG. 9, each of the deposition openings OP1 may have a substantially square shape when viewed in plan, and each of the module openings OP-MD may have a lozenge shape when viewed in plan, however, they should not be limited thereto or thereby.

According to an embodiment, the separation distance between module openings adjacent to each other among the module openings OP-MD may be different from the separation distance between deposition openings adjacent to each other among the deposition openings OP1.

When the mask UM-5 is used, a portion of the display area DA (refer to FIG. 11), which is formed by the module area MDA, may have a transmittance higher than the transmittance of a portion of the display area DA, which is formed by the deposition area A1. An electronic module may be disposed to overlap the display area DA formed by the module area MDA.

Figure 10A:
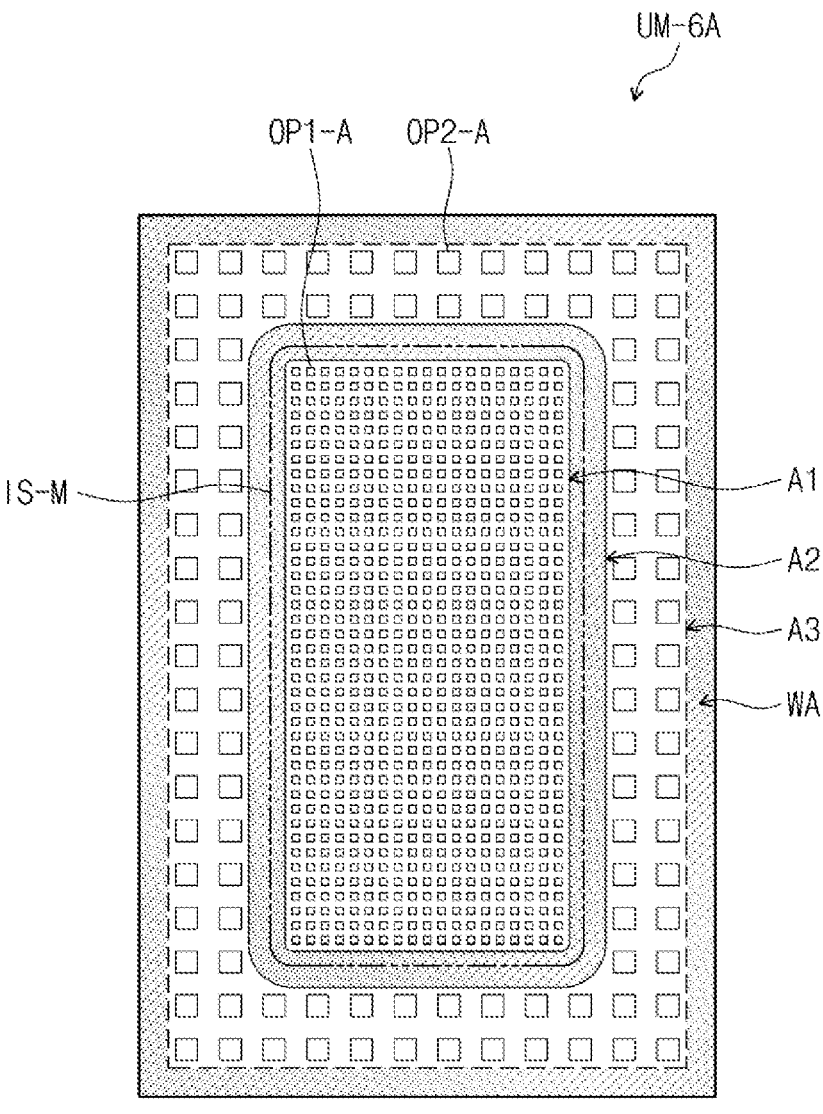
FIG. 10A is a plan view of a sixth embodiment of the individual masks included in the mask assembly in FIG. 2.
Figure 10A:
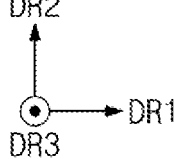
Figure 10B:
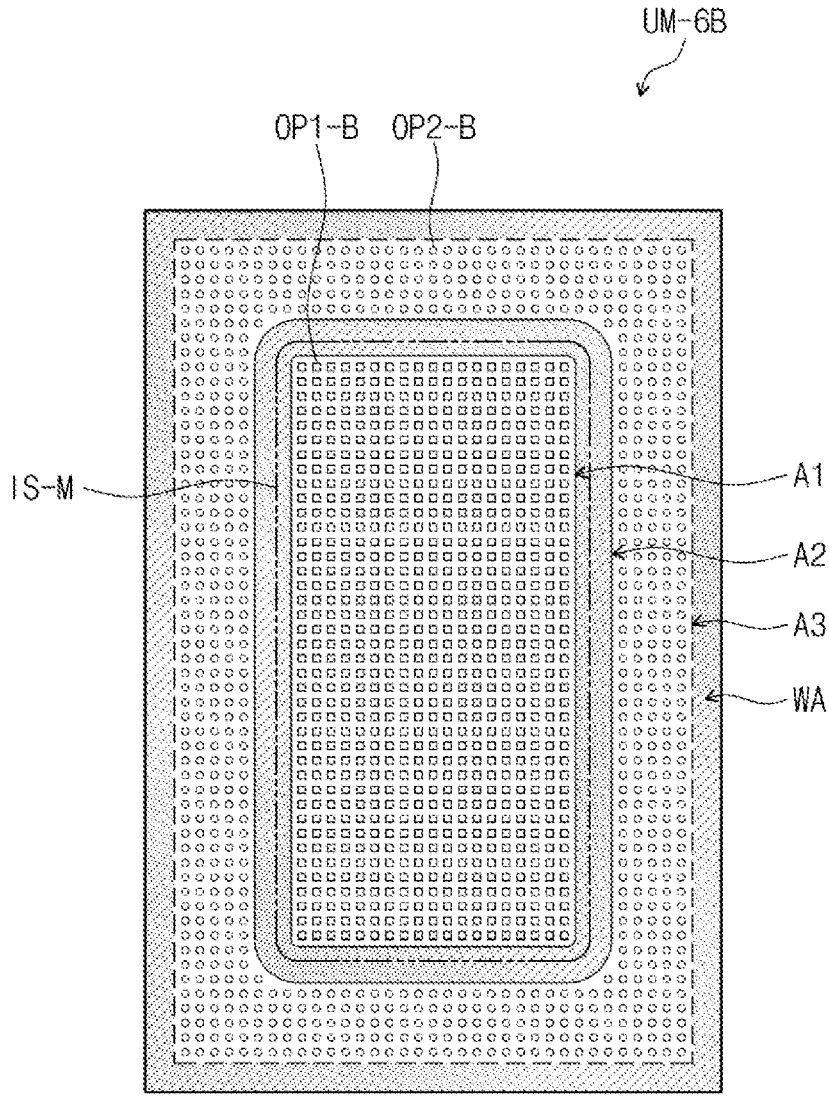
FIG. 10B is a plan view of a seventh embodiment of the individual masks included in the mask assembly in FIG. 2.
Figure 10B:
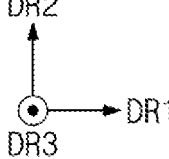

FIG. 10A is a plan view of a sixth embodiment of the individual masks UM-6A included in the mask assembly in FIG. 2. FIG. 10B is a plan view of a seventh embodiment of the individual masks UM-6B included in the mask assembly in FIG. 2. In FIGS. 10A and 10B, the same/similar reference numerals denote the same/similar elements in FIGS. 1 to 4B, and thus, detailed descriptions of the same/similar elements will be omitted to avoid redundancy.

Referring to FIG. 10A, the mask UM-6A may include a deposition area A1, a margin area A2, a peripheral area A3, and a welding area WA. Deposition openings OP1-A may be formed in the deposition area A1, and peripheral openings OP2-A may be formed in the peripheral area A3.

According to an embodiment, each of the deposition openings OP1-A formed in the deposition area A1 may have a size different from the size of each of the peripheral openings OP2-A formed in the peripheral area A3.

In addition, the separation distance between the deposition openings among the deposition openings OP1-A may be different from the separation distance between the peripheral openings adjacent to each other among the peripheral openings OP2-A.

In FIG. 10A, the size of each of the peripheral openings OP2-A is greater than the size of each of the deposition openings OP1-A, however, it should not be limited thereto or thereby. According to an embodiment, the size of each of the peripheral openings OP2-A may be smaller than the size of each of the deposition openings OP1-A.

In addition, in FIG. 10A, the separation distance between the peripheral openings OP2-A is greater than the separation distance between the deposition openings OP1-A, however, it should not be limited thereto or thereby. According to an embodiment, the separation distance between the peripheral openings OP2-A may be smaller than the separation distance between the deposition openings OP1-A.

In addition, according to an embodiment, the size of each of the deposition openings OP1-A may be different from the size of each of the peripheral openings OP2-A, and the separation distance between the deposition openings OP1-A may be substantially the same as the separation distance between the peripheral openings OP2-A. According to an embodiment, the size of each of the deposition openings OP1-A may be substantially the same as the size of each of the peripheral openings OP2-A, and the separation distance between the deposition openings OP1-A may be different from the separation distance between the peripheral openings OP2-A.

According to an embodiment, the size of each of the deposition openings OP1-A and the separation distance between the deposition openings OP1-A may be determined according to a predetermined size and arrangement of each of the light emitting patterns.

However, the size of each of the peripheral openings OP2-A and the separation distance between the peripheral openings OP2-A do not exert influences on the size and arrangement of the light emitting patterns.

Accordingly, the size of each of the peripheral openings OP2-A and the separation distance between the peripheral openings OP2-A should not be particularly limited as long as the tensile force applied to the mask UM-6A may be transmitted to an inner side of the mask UM-6A or the damage caused by the tensile force on the mask UM-6A may be reduced when the mask UM-6A is welded to the open mask OM (refer to FIG. 2). In addition, the size of each of the peripheral openings OP2-A and the separation distance between the peripheral openings OP2-A should not be particularly limited as long as the repulsive force generated between the mask assembly MSA (refer to FIG. 1) and the magnetic substance MM (refer to FIG. 1) may be reduced.

Referring to FIG. 10B, the mask UM-6B may include a deposition area A1, a margin area A2, a peripheral area A3, and a welding area WA. Deposition openings OP1-B A1 may be formed in the deposition area A1, and peripheral openings OP2-B may be formed in the peripheral area A3.

According to an embodiment, the deposition openings OP1-B formed in the deposition area A1 may have a shape different from the shape of the peripheral openings OP2-B formed in the peripheral area A3.

In FIG. 10B, each of the deposition openings OP1-B may have a substantially square shape when viewed in plane, and each of the peripheral openings OP2-B may have a circular shape when viewed in plan, however, the shape of the deposition openings OP1-B and the shape of the peripheral openings OP2-B should not be particularly limited.

As an example, the shape of the deposition openings OP1-B may be changed depending on a shape of light emitting patterns of the display panel DP (refer to FIG. 11) to which a deposition material is deposited. The shape of the peripheral openings OP2-B should not be particularly limited as long as a tensile force applied to the mask UM-6B may be transmitted to an inner side of the mask UM-6B, the damage caused by the tensile force on the mask UM-6B may be reduced, or a repulsive force generated between the mask assembly MSA (refer to FIG. 1) and the magnetic substance MM (refer to FIG. 1) may be reduced.

Figure 11:
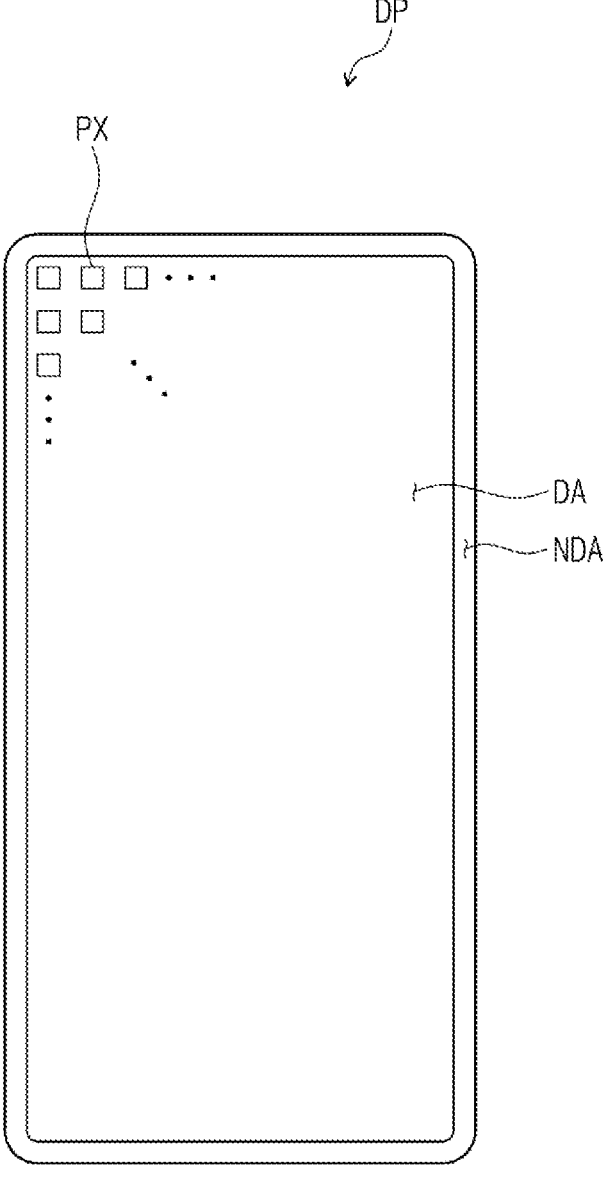
FIG. 11 is a plan view of a display panel constructed according the principles of the invention.
Figure 11:
Figure 12:
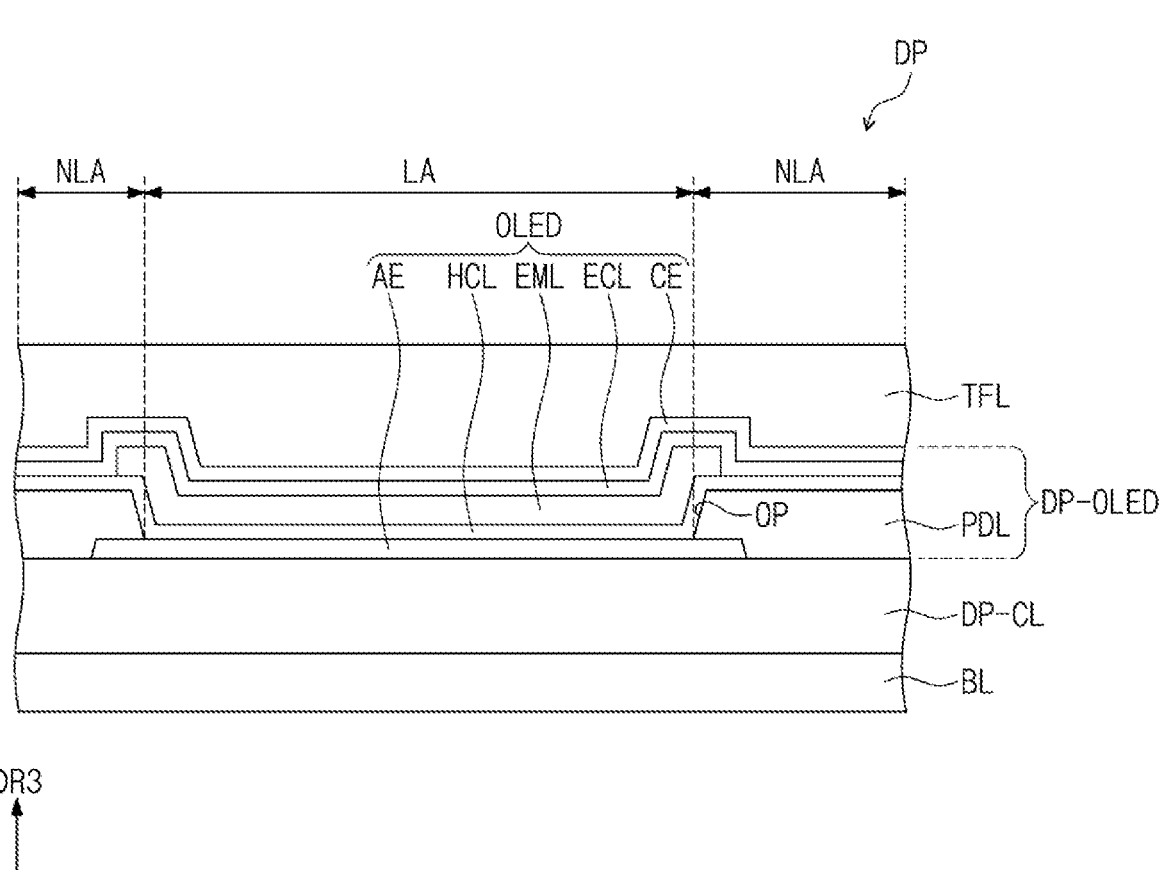
FIG. 12 is a cross-sectional view of a display panel of FIG. 11.

FIG. 11 is a plan view of the display panel DP constructed according to the principles of the invention, and FIG. 12 is a cross-sectional view of the display panel DP of FIG. 11.

The display panel DP shown in FIG. 11 may be a light emitting type display panel. The display panel DP may be one of an inorganic light emitting display panel and an organic light emitting display panel, however, it should not be particularly limited.

The display panel DP may include the display area DA and the non-display area NDA. A pixel PX may be disposed in the display area DA and may not be disposed in the non-display area NDA. The non-display area NDA may be defined along an edge of the display panel DP. The non-display area NDA may surround the display area DA.

According to the illustrated embodiment, the non-display area NDA may correspond to the dead space described with reference to FIG. 4B. Accordingly, as the precision in deposition increases, the width of the non-display area NDA may decrease.

Since the manufacturing precision of the mask UM (refer to FIG. 2) is high and the area in which the deposition material EM (refer to FIG. 1) is deposited is determined by the deposition openings OP1 (refer to FIG. 3) formed through the mask UM, the deposition precision may be improved even though the process tolerance of the first opening OP-M (refer to FIG. 2) formed through the open mask OM (refer to FIG. 2) is not reduced. Accordingly, the width of the non-display area NDA of the display panel DP may be reduced.

Referring to FIG. 12, the display panel DP may include a base layer BL, a circuit element layer DP-CL disposed on the base layer BL, a display element layer DP-OLED disposed on the circuit element layer DP-CL, and an encapsulation layer TFL disposed on the display element layer DP-OLED.

The base layer BL may be a glass substrate, a metal substrate, or a polymer substrate, however, it should not be limited thereto or thereby. The base layer BL may include an inorganic layer, an organic layer, or an organic/inorganic composite material layer.

The circuit element layer DP-CL may include at least one insulating layer and a circuit element. The circuit element may include a signal line and a driving circuit of the pixel. The circuit element layer DP-CL may be formed by forming an insulating layer, a semiconductor layer, and a conductive layer using a coating or depositing process and patterning the insulating layer, the semiconductor layer, and the conductive layer using a photolithography process.

The display element layer DP-OLED may include a pixel definition layer PDL and a light emitting element OLED. The light emitting element OLED may be an organic light emitting diode or a quantum dot light emitting diode.

A first electrode AE may be disposed on the circuit element layer DP-CL. The pixel definition layer PDL may have an opening OP formed therethrough to expose at least a portion of the first electrode AE. The opening OP of the pixel definition layer PDL may define a light emitting area LA. A non-light-emitting area NLA may surround the light emitting area LA.

A hole control layer HCL, an electron control layer ECL, and a second electrode CE may be commonly disposed in the light emitting area LA and the non-light-emitting area NLA. The hole control layer HCL and the electron control layer ECL may be commonly formed in the pixels PX (refer to FIG. 11) using a mask different from the mask assembly MSA (refer to FIG. 2).

A light emitting layer EML may be patterned to correspond to the opening OP. The light emitting layer EML having a predetermined shape may be formed using the mask assembly MSA (refer to FIG. 2) described above.

However, the illustrated embodiment should not be limited to the embodiments described above, and any component of the display panel DP may be formed using the deposition apparatus EDA (refer to FIG. 1) as long as the component is able be deposited though the mask assembly MSA (refer to FIG. 1).

The encapsulation layer TFL may be disposed on the light emitting element OLED. The encapsulation layer TFL may include a plurality of thin layers. The thin layers may include an inorganic layer and an organic layer. The encapsulation layer TFL may include an insulating layer to encapsulate the display element layer DP-OLED and an insulating layer to improve a light emission efficiency.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A mask assembly comprising:

a first mask having a first opening; and at least one second mask disposed on the first mask, each of the at least one second mask comprising a deposition area having second openings, an inner area surrounding the deposition area, and an outer area having third openings which surround the inner area, wherein a line defining an outer boundary of an inner surface which defines the first opening overlaps the inner area when viewed in plan, wherein the at least one second mask defines a thickness direction, wherein the inner area is solid with no openings formed therein, and wherein a minimum width of the inner area in a direction orthogonal to the thickness direction is greater than a maximum separation distance between adjacent second openings of the seconds openings.

2. The mask assembly of claim 1, wherein the inner area has a closed-line shape when viewed in plan.

3. The mask assembly of claim 1, wherein the third openings are covered by the first mask when viewed from a rear side of the first mask.

4. The mask assembly of claim 1, wherein the inner area has a width between about 200 micrometers and about 500 micrometers when viewed in plan.

5. The mask assembly of claim 1, wherein each of the second openings has a size different from a size of each of the third openings.

6. The mask assembly of claim 1, wherein a separation distance between the second openings adjacent to each other among the second openings is different from a separation distance between the third openings adjacent to each other among the third openings.

7. The mask assembly of claim 1, wherein the second openings have a shape different from a shape of the third openings.

8. The mask assembly of claim 1, wherein each of the second mask further comprises a welding area attached to the first mask and surrounding the outer area.

9. The mask assembly of claim 1, wherein a boundary between the deposition area and the inner area is defined as a first boundary line, a boundary between the inner area and the outer area is defined as a second boundary line when viewed in plan, and the first boundary line comprises a portion projecting toward the deposition area.

10. The mask assembly of claim 9, wherein the second boundary line comprises a portion projecting toward the deposition area to correspond to the projecting portion of the first boundary line.

11. The mask assembly of claim 1, further comprising a module area surrounded by the deposition area and provided with module openings formed therein, wherein the module openings have a shape different from a shape of the second openings.

12. The mask assembly of claim 1, further comprising a non-deposition area surrounded by the deposition area.

13. The mask assembly of claim 1, wherein the second mask has a thickness in at least a portion of the inner area smaller than a thickness of the second mask in the deposition area.

14. The mask assembly of claim 1, wherein the second mask comprises at least one of stainless steel, Invar, nickel, cobalt, nickel alloy, and nickel-cobalt alloy.

* * * * *